US 9,374,005 B2

(12) United States Patent
Rozek et al.

(10) Patent No.: US 9,374,005 B2
(45) Date of Patent: Jun. 21, 2016

(54) EXPANDED RANGE DC-DC CONVERTER

(71) Applicant: RF Micro Devices, Inc., Greensboro, NC (US)

(72) Inventors: Ashraf Rozek, Greensboro, NC (US); Michael R. Kay, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 8 days.

(21) Appl. No.: 14/458,341

(22) Filed: Aug. 13, 2014

(65) Prior Publication Data

US 2015/0048891 A1     Feb. 19, 2015

Related U.S. Application Data

(60) Provisional application No. 61/865,456, filed on Aug. 13, 2013.

(51) Int. Cl.
*H03G 3/20* (2006.01)
*H02M 3/158* (2006.01)
(Continued)

(52) U.S. Cl.
CPC .............. *H02M 3/158* (2013.01); *H02M 3/07* (2013.01); *H03F 1/0227* (2013.01); *H03F 3/005* (2013.01); *H03F 3/19* (2013.01); *H03F 3/195* (2013.01); *H03F 3/21* (2013.01); *H03F 3/245* (2013.01); *H02M 2001/007* (2013.01); *H03F 2200/102* (2013.01); *H03F 2200/451* (2013.01)

(58) Field of Classification Search
CPC ............................ H03F 1/0227; H03F 1/0238
USPC .......................................... 330/127, 136, 297
See application file for complete search history.

(56) References Cited

U.S. PATENT DOCUMENTS 3,969,682 A     7/1976   Rossum
3,980,964 A     9/1976   Grodinsky
(Continued)

FOREIGN PATENT DOCUMENTS

CN     1076567 A     9/1993
CN     1211355 A     3/1999
(Continued)

OTHER PUBLICATIONS

Author Unknown, "Automatically," Definition, Dictionary.com Unabridged, 2015, pp. 1-6, http://dictionary.reference.com/browse/automatically.

(Continued)

*Primary Examiner* — Steven J Mottola
(74) *Attorney, Agent, or Firm* — Withrow & Terranova, P.L.L.C.

(57) ABSTRACT

A DC-DC converter, which provides a converter output voltage using a DC source voltage, is disclosed. The DC-DC converter includes converter control circuitry and a boosting charge pump. The converter control circuitry selects one of a first boost operating mode, a second boost operating mode, and a boost disabled mode based on the DC source voltage. During the boost disabled mode, the boosting charge pump presents a high impedance at a charge pump output of the boosting charge pump. Otherwise, the boosting charge pump provides a charge pump output voltage. During the first boost operating mode, a nominal value of the charge pump output voltage is equal to about one and one-half times the DC source voltage. During the second boost operating mode, a nominal value of the charge pump output voltage is equal to about two times the DC source voltage.

19 Claims, 10 Drawing Sheets

(51) Int. Cl.
    *H03F 1/02*     (2006.01)
    *H03F 3/19*     (2006.01)
    *H03F 3/21*     (2006.01)
    *H02M 3/07*     (2006.01)
    *H03F 3/00*     (2006.01)
    *H03F 3/195*    (2006.01)
    *H03F 3/24*     (2006.01)
    *H02M 1/00*     (2006.01)

(56)            References Cited

U.S. PATENT DOCUMENTS

| | | |
|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,339,041 A | 8/1994 | Nitardy |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,646,501 B1 | 11/2003 | Wessel |
| 6,658,445 B1 | 12/2003 | Gau et al. |
| 6,681,101 B1 | 1/2004 | Eidson et al. |
| 6,686,727 B2 | 2/2004 | Ledenev et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,920,023 B1 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,358,113 B2 | 1/2013 | Cheng et al. |
| 8,362,837 B2 | 1/2013 | Koren et al. |

(56) References Cited

U.S. PATENT DOCUMENTS

| | | |
|---|---|---|
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,693,676 B2 * | 4/2014 | Xiao .................. H04L 25/0272 326/30 |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,651 B2 | 1/2015 | Jones |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,075,673 B2 | 7/2015 | Khlat et al. |
| 9,077,405 B2 | 7/2015 | Jones et al. |
| 9,099,961 B2 | 8/2015 | Kay et al. |
| 9,112,452 B1 | 8/2015 | Khlat |
| 2002/0071497 A1 | 6/2002 | Bengtsson et al. |
| 2002/0125869 A1 | 9/2002 | Groom et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0184713 A1 | 8/2005 | Xu et al. |
| 2005/0200407 A1 | 9/2005 | Arai et al. |
| 2005/0208907 A1 | 9/2005 | Yamazaki et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0147062 A1 * | 7/2006 | Niwa .................... H03F 1/0211 381/113 |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0054635 A1 | 3/2007 | Black et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0157745 A1 | 7/2008 | Nakata |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0015229 A1 | 1/2009 | Kotikalapoodi |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0140706 A1 | 6/2009 | Taufik et al. |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |

(56) References Cited

U.S. PATENT DOCUMENTS

| | | |
|---|---|---|
| 2010/0027301 A1 | 2/2010 | Hoyerby |
| 2010/0045247 A1 | 2/2010 | Blanken et al. |
| 2010/0171553 A1 | 7/2010 | Okubo et al. |
| 2010/0181973 A1 | 7/2010 | Pauritsch et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084756 A1 | 4/2011 | Saman et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0193629 A1 | 8/2011 | Hou et al. |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2011/0304400 A1 | 12/2011 | Stanley |
| 2012/0025907 A1 | 2/2012 | Koo et al. |
| 2012/0025919 A1 | 2/2012 | Huynh |
| 2012/0032658 A1 | 2/2012 | Casey et al. |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0212197 A1 | 8/2012 | Fayed et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0274235 A1 | 11/2012 | Lee et al. |
| 2012/0299647 A1 | 11/2012 | Honjo et al. |
| 2012/0313701 A1 | 12/2012 | Khlat et al. |
| 2013/0024142 A1 | 1/2013 | Folkmann et al. |
| 2013/0034139 A1 | 2/2013 | Khlat et al. |
| 2013/0038305 A1 | 2/2013 | Arno et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154728 A1 | 6/2013 | Basaran et al. |
| 2013/0154729 A1 | 6/2013 | Folkmann et al. |
| 2013/0169245 A1 | 7/2013 | Kay et al. |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0042999 A1 | 2/2014 | Barth et al. |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184335 A1 | 7/2014 | Nobbe et al. |
| 2014/0203868 A1 | 7/2014 | Khlat et al. |
| 2014/0203869 A1 | 7/2014 | Khlat et al. |
| 2014/0225674 A1 | 8/2014 | Folkmann et al. |
| 2014/0266427 A1 | 9/2014 | Chiron |
| 2014/0285164 A1 | 9/2014 | Oishi et al. |
| 2014/0306769 A1 | 10/2014 | Khlat et al. |
| 2015/0180422 A1 | 6/2015 | Khlat et al. |
| 2015/0234402 A1 | 8/2015 | Kay et al. |

FOREIGN PATENT DOCUMENTS

| | | |
|---|---|---|
| CN | 1518209 A | 8/2004 |
| CN | 1898860 A | 1/2007 |
| CN | 101106357 A | 1/2008 |
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| EP | 0755121 A2 | 1/1997 |
| EP | 1047188 A2 | 10/2000 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| JP | 2010166157 A | 7/2010 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Final Office Action for U.S. Appl. No. 13/689,883, mailed Dec. 23, 2015, 12 pages.

Final Office Action for U.S. Appl. No. 13/714,600, mailed Dec. 24, 2015, 15 pages.

(56) References Cited

OTHER PUBLICATIONS

Notice of Allowance for U.S. Appl. No. 13/747,725, mailed Oct. 28, 2015, 9 pages.
Advisory Action for U.S. Appl. No. 13/689,922, mailed Dec. 18, 2015, 3 pages.
Notice of Allowance for U.S. Appl. No. 13/727,911, mailed Nov. 10, 2015, 8 pages.
Notice of Allowance for U.S. Appl. No. 14/163,229, mailed Nov. 5, 2015, 8 pages.
Final Office Action for U.S. Appl. No. 14/163,256, mailed Nov. 2, 2015, 10 pages.
Corrected Notice of Allowability for U.S. Appl. No. 13/689,940, mailed Nov. 17, 2015, 4 pages.
Final Office Action for U.S. Appl. No. 14/082,629, mailed Nov. 4, 2015, 17 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html? cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm^2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujire%20Files%20100th%20Envelope%20Tracking%20Patent&type=n.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
Non-final Office Action for U.S. Appl. No. 11/113,873, now U.S. Pat. No. 7,773,691, mailed Feb. 1, 2008, 17 pages.
Final Office Action for U.S. Appl. No. 11/113,873, now U.S. Pat. No. 7,773,691, mailed Jul. 30, 2008, 19 pages.
Non-final Office Action for U.S. Appl. No. 11/113,873, now U.S. Pat. No. 7,773,691, mailed Nov. 26, 2008, 22 pages.
Final Office Action for U.S. Appl. No. 11/113,873, now U.S. Pat. No. 7,773,691, mailed May 4, 2009, 20 pages.
Non-final Office Action for U.S. Appl. No. 11/113,873, now U.S. Pat. No. 7,773,691, mailed Feb. 3, 2010, 21 pages.
Notice of Allowance for U.S. Appl. No. 11/113,873, now U.S. Pat. No. 7,773,691, mailed Jun. 9, 2010, 7 pages.
International Search Report for PCT/US06/12619, mailed May 8, 2007, 2 pages.
Extended European Search Report for application 06740532.4, mailed Dec. 7, 2010, 7 pages.
Non-Final Office Action for U.S. Appl. No. 12/112,006, mailed Apr. 5, 2010, 6 pages.
Notice of Allowance for U.S. Appl. No. 12/112,006, mailed Jul. 19, 2010, 6 pages.
Non-Final Office Action for U.S. Appl. No. 12/836,307, mailed Nov. 5, 2013, 6 pages.
Notice of Allowance for U.S. Appl. No. 12/836,307, mailed May 5, 2014, 6 pages.
Non-Final Office Action for U.S. Appl. No. 12/836,307, mailed Sep. 25, 2014, 5 pages.
Non-Final Office Action for U.S. Appl. No. 13/089,917, mailed Nov. 23, 2012, 6 pages.
Examination Report for European Patent Application No. 11720630, mailed Aug. 16, 2013, 5 pages.
Examination Report for European Patent Application No. 11720630.0 issued Mar. 18, 2014, 4 pages.
European Search Report for European Patent Application No. 14162682.0, issued Aug. 27, 2014, 7 pages.
International Search Report for PCT/US11/033037, mailed Aug. 9, 2011, 10 pages.
International Preliminary Report on Patentability for PCT/US2011/033037, mailed Nov. 1, 2012, 7 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Non-Final Office Action for U.S. Appl. No. 14/702,192, mailed Oct. 7, 2015, 7 pages.
Second Office Action for Chinese Patent Application No. 201180030273.5, issued Aug. 14, 2015, 8 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
Notice of Allowance for U.S. Appl. No. 13/661,164, mailed Oct. 21, 2015, 7 pages.

(56) References Cited

OTHER PUBLICATIONS

Non-Final Office Action for U.S. Appl. No. 14/254,215, mailed Oct. 15, 2015, 5 pages.
First Office Action for Chinese Patent Application No. 201180067293.X, mailed Aug. 6, 2015, 13 pages.
Notice of Allowance for U.S. Appl. No. 13/486,012, mailed Nov. 21, 2014, 8 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Notice of Allowance for U.S. Appl. No. 13/647,815, mailed Sep. 19, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
Final Office Action for U.S. Appl. No. 13/689,883, mailed Jan. 2, 2015, 13 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/661,227, mailed Sep. 29, 2014, 24 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
Notice of Allowance for U.S. Appl. No. 13/690,187, mailed Dec. 19, 2014, 8 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Notice of Allowance for U.S. Appl. No. 13/684,826, mailed Sep. 8, 2014, 6 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/714,600, mailed Oct. 15, 2014, 13 pages.
Non-Final Office Action for U.S. Appl. No. 13/782,142, mailed Sep. 4, 2014, 6 pages.
Notice of Allowance for U.S. Appl. No. 13/747,694, mailed Dec. 22, 2014, 9 pages.
Notice of Allowance for U.S. Appl. No. 13/914,888, mailed Oct. 17, 2014, 10 pages.
Non-Final Office Action for U.S. Appl. No. 13/951,976, mailed Apr. 4, 2014, 7 pages.
Notice of Allowance for U.S. Appl. No. 13/951,976, mailed Dec. 26, 2014, 9 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
Non-Final Office Action for U.S. Appl. No. 13/747,725, mailed Oct. 7, 2014, 6 pages.
Non-Final Office Action for U.S. Appl. No. 13/747,749, mailed Nov. 12, 2014, 32 pages.
International Search Report and Written Opinion for PCT/US2014/012927, mailed Sep. 30, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
International Search Report and Written Opinion for PCT/US2014/028178, mailed Sep. 30, 2014, 17 pages.
Notice of Allowance for U.S. Appl. No. 13/948,291, mailed Feb. 11, 2015, 7 pages.
First Office Action for Chinese Patent Application No. 201180030273.5, issued Dec. 3, 2014, 15 pages. (with English translation).
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
International Preliminary Report on Patentability for PCT/US2013/052277, mailed Feb. 5, 2015, 9 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
European Search Report for European Patent Application No. 14190851.7, issued Mar. 5, 2015, 6 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.

(56) References Cited

OTHER PUBLICATIONS

Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
European Examination Report for European Patent Application No. 14162682.0, mailed May 22, 2015, 5 pages.
Corrected Notice of Allowance for U.S. Appl. No. 13/297,470, mailed Jun. 5, 2015, 11 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
First Office Action for Chinese Patent Application No. 201280052694.2, issued Mar. 24, 2015, 35 pages.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
First Office Action and Search Report for Chinese Patent Application No. 201280007941.7, issued May 13, 2015, 13 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Notice of Allowance for U.S. Appl. No. 13/747,725, mailed Sep. 1, 2015, 9 pages.
Notice of Allowance for U.S. Appl. No. 14/027,416, mailed Aug. 11, 2015, 9 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Non-Final Office Action for U.S. Appl. No. 13/188,024, mailed Feb. 5, 2013, 8 pages.
Notice of Allowance for U.S. Appl. No. 13/188,024, mailed Jun. 18, 2013, 8 pages.
International Search Report for PCT/US2011/044857, mailed Oct. 24, 2011, 10 pages.
International Preliminary Report on Patentability for PCT/US2011/044857, mailed Mar. 7, 2013, 6 pages.
Non-Final Office Action for U.S. Appl. No. 13/218,400, mailed Nov. 8, 2012, 7 pages.
Notice of Allowance for U.S. Appl. No. 13/218,400, mailed Apr. 11, 2013, 7 pages.
International Search Report for PCT/US11/49243, mailed Dec. 22, 2011, 9 pages.
International Preliminary Report on Patentability for PCT/US11/49243, mailed Nov. 13, 2012, 33 pages.
International Search Report for PCT/US2011/054106, mailed Feb. 9, 2012, 11 pages.
International Preliminary Report on Patentability for PCT/US2011/054106, mailed Apr. 11, 2013, 8 pages.
Notice of Allowance for U.S. Appl. No. 13/297,490, mailed Feb. 27, 2014, 7 pages.
Invitation to Pay Additional Fees for PCT/US2011/061007, mailed Feb. 13, 2012, 7 pages.
International Search Report for PCT/US2011/061007, mailed Aug. 16, 2012, 16 pages.
International Preliminary Report on Patentability for PCT/US2011/061007, mailed May 30, 2013, 11 pages.
Non-Final Office Action for U.S. Appl. No. 13/297,470, mailed May 8, 2013, 15 pages.
Final Office Action for U.S. Appl. No. 13/297,470, mailed Oct. 25, 2013, 17 pages.
Non-Final Office Action for U.S. Appl. No. 13/297,470, mailed Feb. 20, 2014, 16 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
International Search Report for PCT/US2011/061009, mailed Feb. 8, 2012, 14 pages.
International Preliminary Report on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Notice of Allowance for U.S. Appl. No. 13/367,973, mailed Sep. 15, 2014, 7 pages.
Invitation to Pay Additional Fees and Where Applicable Protest Fee for PCT/US2012/024124, mailed Jun. 1, 2012, 7 pages.

(56) References Cited

OTHER PUBLICATIONS

International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 14/072,140, mailed Dec. 2, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
First Office Action for Chinese Patent Application No. 201280026559.0, issued Nov. 3, 2014, 14 pages (with English translation).
Extended European Search Report for European Patent Application No. 12794149.0, issued Oct. 29, 2014, 6 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
First Office Action for Chinese Patent Application No. 201280042523.1, issued Dec. 4, 2015, 12 pages.
Notice of Allowance for U.S. Appl. No. 14/072,225, mailed Feb. 3, 2016, 7 pages.
Final Office Action for U.S. Appl. No. 13/661,227, mailed Feb. 9, 2016, 28 pages.
Advisory Action for U.S. Appl. No. 14/082,629, mailed Jan. 22, 2016, 3 pages.
Non-Final Office Action for U.S. Appl. No. 13/876,518, mailed Jan. 20, 2016, 16 pages.
Notice of Allowance for U.S. Appl. No. 14/163,256, mailed Feb. 10, 2016, 8 pages.
First Office Action for Chinese Patent Application No. 201280052739.6, mailed Mar. 3, 2016, 31 pages.
Communication under Rule 164(2)(a) EPC for European Patent Application No. 12725911.7, mailed Feb. 17, 2016, 8 pages.
Examination Report for European Patent Application No. 14190851.7, mailed May 2, 2016, 5 pages.
Advisory Action for U.S. Appl. No. 13/689,883, mailed Mar. 4, 2016, 3 pages.
Advisory Action for U.S. Appl. No. 13/714,600, mailed Mar. 14, 2016, 3 pages.
Notice of Allowance for U.S. Appl. No. 13/689,922, mailed Mar. 18, 2016, 9 pages.
Notice of Allowance for U.S. Appl. No. 14/101,770, mailed Apr. 11, 2016, 6 pages.
Notice of Allowance for U.S. Appl. No. 14/151,167, mailed Mar. 4, 2016, 7 pages.
Non-Final Office Action for U.S. Appl. No. 14/082,629, mailed Mar. 16, 2016, 23 pages.
Notice of Allowance for U.S. Appl. No. 14/702,192, mailed Feb. 22, 2016, 8 pages.
Notice of Allowance for U.S. Appl. No. 14/254,215, mailed Feb. 18, 2016, 7 pages.
Non-Final Office Action for U.S. Appl. No. 13/689,883, mailed Apr. 20, 2016, 13 pages.
Non-Final Office Action for U.S. Appl. No. 13/714,600, mailed May 4, 2016, 14 pages.

* cited by examiner

EXPANDED RANGE DC-DC CONVERTER

RELATED APPLICATIONS

This application claims the benefit of U.S. provisional patent application No. 61/865,456, filed Aug. 13, 2013, the disclosure of which is hereby incorporated herein by reference in its entirety.

FIELD OF THE DISCLOSURE

Embodiments of the present disclosure relate to DC-DC converters, which may be used in RF communication systems.

BACKGROUND

Portable devices, such as portable wireless communications devices, are typically battery powered and need to be relatively small, and have low cost. As such, to minimize size, cost, and power consumption, DC-DC converters in such devices need to be as simple, small, and efficient as is practical. Thus, there is a need for DC-DC converters that are low cost, small, simple, and efficient.

SUMMARY

A DC-DC converter, which provides a converter output voltage using a DC source voltage, is disclosed according to one embodiment of the present disclosure. The DC-DC converter includes converter control circuitry and a boosting charge pump, which has a charge pump output. The converter control circuitry selects one of a first boost operating mode, a second boost operating mode, and a boost disabled mode based on the DC source voltage. During the boost disabled mode, the boosting charge pump presents a high impedance at the charge pump output. During the first boost operating mode, the boosting charge pump provides a charge pump output voltage via the charge pump output, such that a nominal value of the charge pump output voltage is equal to about one and one-half times the DC source voltage. During the second boost operating mode, the boosting charge pump provides the charge pump output voltage via the charge pump output, such that a nominal value of the charge pump output voltage is equal to about two times the DC source voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

A DC-DC converter, which provides a converter output voltage using a DC source voltage, is disclosed according to one embodiment of the present disclosure. The DC-DC converter includes converter control circuitry and a boosting charge pump, which has a charge pump output. The converter control circuitry selects one of a first boost operating mode, a second boost operating mode, and a boost disabled mode based on the DC source voltage. During the boost disabled mode, the boosting charge pump presents a high impedance at the charge pump output. During the first boost operating mode, the boosting charge pump provides a charge pump output voltage via the charge pump output, such that a nominal value of the charge pump output voltage is equal to about one and one-half times the DC source voltage. During the second boost operating mode, the boosting charge pump provides the charge pump output voltage via the charge pump output, such that a nominal value of the charge pump output voltage is equal to about two times the DC source voltage.

Figure 1:
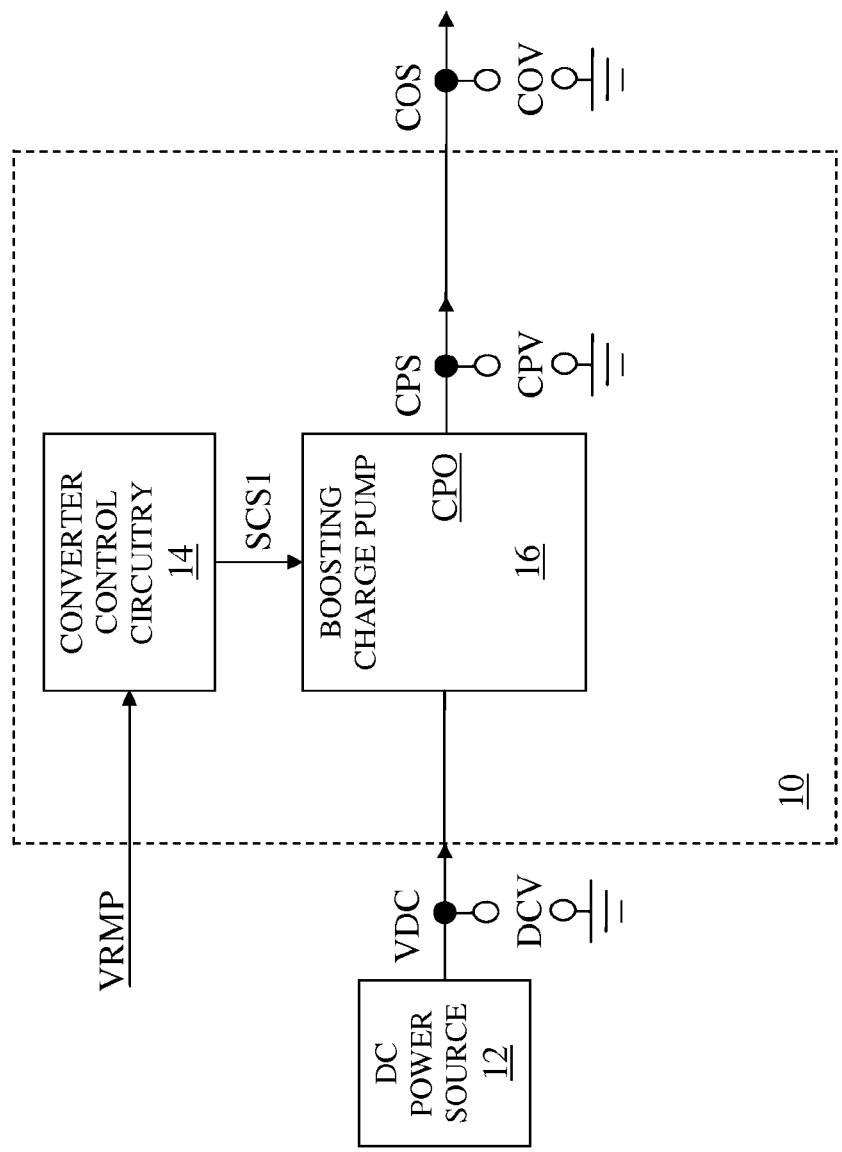
FIG. 1 shows a DC-DC converter and a DC power source according to one embodiment of the DC-DC converter and the DC power source.

FIG. 1 shows a DC-DC converter 10 and a DC power source 12 according to one embodiment of the DC-DC converter 10 and the DC power source 12. The DC-DC converter 10 includes converter control circuitry 14 and a boosting charge pump 16, which has a charge pump output CPO. The DC power source 12 provides a DC source signal VDC, which has a DC source voltage DCV, to the boosting charge pump 16. In one embodiment of the DC power source 12, the DC power source 12 is a battery. The boosting charge pump 16 receives power from the DC power source 12 via the DC source signal VDC and boosts the DC source voltage DCV to provide a charge pump output signal CPS, which has a charge pump output voltage CPV. In the embodiment shown, the charge pump output signal CPS is a converter output signal COS from the DC-DC converter 10. As such, the converter output signal COS has a converter output voltage COV. In this regard, in the embodiment of the DC-DC converter 10 illustrated in FIG. 1, the charge pump output voltage CPV is the converter output voltage COV. The converter control circuitry 14 receives a power supply control signal VRMP. In one embodiment of the power supply control signal VRMP, the power supply control signal VRMP is representative of a setpoint of the converter output voltage COV.

The converter control circuitry 14 provides a first charge pump switching control signal SCS1 to the boosting charge pump 16. As such, the converter control circuitry 14 controls operation of the boosting charge pump 16 via the first charge pump switching control signal SCS1. In one embodiment of the converter control circuitry 14, the converter control circuitry 14 controls the boosting charge pump 16 using switching elements 18, 20, 22, 24, 26, 28, 30, 32, 34 (FIG. 2) in the boosting charge pump 16.

In one embodiment of the DC-DC converter 10, the DC-DC converter 10 provides the converter output voltage COV using the DC source voltage DCV. As such, the converter control circuitry 14 selects one of a first boost operating mode, a second boost operating mode, and a boost disabled mode based on the DC source voltage DCV. The boosting charge pump 16 has a charge pump output CPO, such that during the boost disabled mode, the boosting charge pump 16 presents a high impedance at the charge pump output CPO. High impedance at the charge pump output CPO is defined, such that only undesirable paths to, from, or both, the charge pump output CPO are present. Such undesirable paths may include leakage currents, parasitic couplings, the like, or any combination thereof.

In one embodiment of the high impedance, the high impedance is greater than 10,000 ohms. In one embodiment of the high impedance, the high impedance is greater than 100,000 ohms. In one embodiment of the high impedance, the high impedance is greater than 1,000,000 ohms. In one embodiment of the high impedance, the high impedance is greater than 10,000,000 ohms. In one embodiment of the high impedance, the high impedance is greater than 100,000,000 ohms. In one embodiment of the high impedance, the high impedance is less than 100,000,000,000 ohms.

In one embodiment of the DC-DC converter 10, the boosting charge pump 16 provides the charge pump output voltage CPV via the charge pump output CPO, such that during the first boost operating mode, the charge pump output voltage CPV has first nominal value, and during the second boost operating mode, the charge pump output voltage CPV has second nominal value, which is greater than the first nominal value.

In one embodiment of the DC-DC converter 10, during the first boost operating mode, the boosting charge pump 16 provides the charge pump output voltage CPV via the charge pump output CPO, such that the first nominal value of the charge pump output voltage CPV is equal to about one and one-half times the DC source voltage DCV.

In one embodiment of the DC-DC converter 10, during the second boost operating mode, the boosting charge pump 16 provides the charge pump output voltage CPV via the charge pump output CPO, such that the second nominal value of the charge pump output voltage CPV is equal to about two times the DC source voltage DCV.

In one embodiment of the DC-DC converter 10, the DC-DC converter 10 is only capable of boosting the DC source voltage DCV to provide the converter output voltage COV. As such, the converter control circuitry 14 selects the boost disabled mode when the setpoint of the converter output voltage COV is less than the DC source voltage DCV minus an operating headroom. The operating headroom is an operating voltage drop inside the DC-DC converter 10, such that the DC-DC converter 10 is only capable of boosting the DC source voltage DCV to provide the converter output voltage COV after overcoming the operating headroom.

In one embodiment of the DC-DC converter 10, the converter control circuitry 14 selects the first boost operating mode when the DC source voltage DCV is above a first source threshold and when the setpoint of the converter output voltage COV is above the DC source voltage DCV. Conversely, in one embodiment of the DC-DC converter 10, the converter control circuitry 14 selects the second boost operating mode when the DC source voltage DCV is below the first source threshold and when the setpoint of the converter output voltage COV is above the DC source voltage DCV.

In one embodiment of the DC-DC converter 10, the first source threshold is representative of an operating point in the boosting charge pump 16, such that the second boost operating mode may be used without damaging the switching elements 18, 20, 22, 24, 26, 28, 30, 32, 34 (FIG. 2) in the boosting charge pump 16. In this regard, in one embodiment of the switching elements 18, 20, 22, 24, 26, 28, 30, 32, 34 (FIG. 2), a maximum voltage rating of the switching elements 18, 20, 22, 24, 26, 28, 30, 32, 34 (FIG. 2) is greater than two times the first source threshold. In an alternate embodiment of the switching elements 18, 20, 22, 24, 26, 28, 30, 32, 34 (FIG. 2), the switching elements 18, 20, 22, 24, 26, 28, 30, 32, 34 (FIG. 2) are switching transistor elements, such that a maximum voltage rating of the switching transistor elements is greater than two times the first source threshold. In one embodiment of the DC-DC converter 10, the first source threshold is equal to about 2.9 volts and the maximum voltage rating of each of the switching transistor elements is greater than or equal to about six volts.

Figure 2:
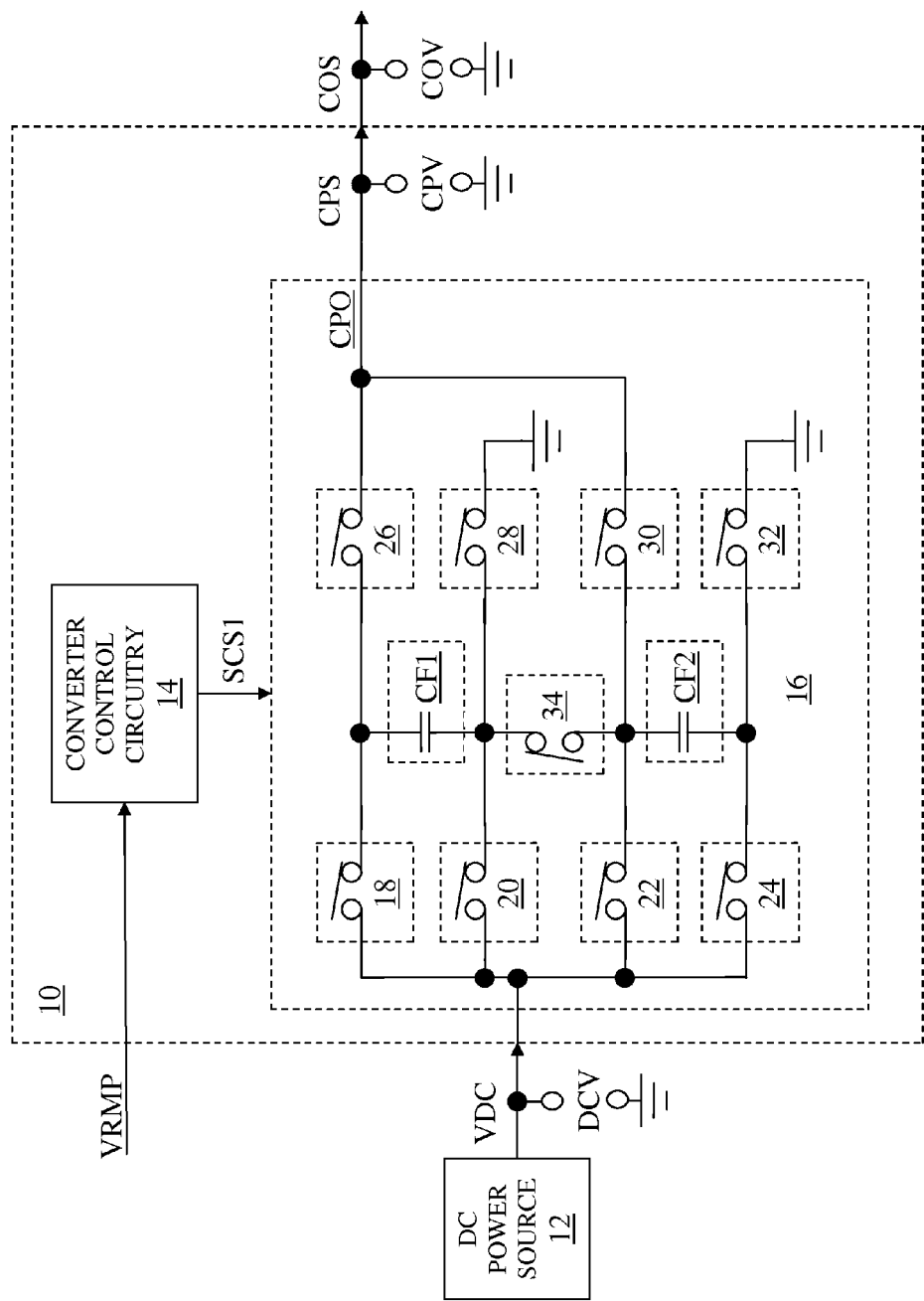
FIG. 2 shows details of a boosting charge pump illustrated in FIG. 1 according to one embodiment of the boosting charge pump.

FIG. 2 shows details of the boosting charge pump 16 illustrated in FIG. 1 according to one embodiment of the boosting charge pump 16. The boosting charge pump 16 includes a first switching element 18, a second switching element 20, a third switching element 22, a fourth switching element 24, a fifth switching element 26, a sixth switching element 28, a seventh switching element 30, an eighth switching element 32, a ninth switching element 34, a first flying capacitive element CF1, and a second flying capacitive element CF2. The converter control circuitry 14 controls each of the switching elements 18, 20, 22, 24, 26, 28, 30, 32, 34 using the first charge pump switching control signal SCS1. As such, each of the switching elements 18, 20, 22, 24, 26, 28, 30, 32 is selected to be in one of an OPEN state and a CLOSED state based on the first charge pump switching control signal SCS1. As such, the first charge pump switching control signal SCS1 is a multi-bit signal.

The first switching element 18 is coupled between the DC power source 12 and a first end of the first flying capacitive element CF1. The second switching element 20 is coupled between the DC power source 12 and a second end of the first flying capacitive element CF1. The third switching element 22 is coupled between the DC power source 12 and a first end of the second flying capacitive element CF2. The fourth switching element 24 is coupled between the DC power source 12 and a second end of the second flying capacitive element CF2.

The fifth switching element 26 is coupled between the charge pump output CPO and the first end of the first flying capacitive element CF1. The sixth switching element 28 is coupled between the second end of the first flying capacitive element CF1 and ground. The seventh switching element 30 is coupled between the charge pump output CPO and the first end of the second flying capacitive element CF2. The eighth switching element 32 is coupled between the second end of the second flying capacitive element CF2 and ground. The ninth switching element 34 is coupled between the second end of the first flying capacitive element CF1 and the first end of the second flying capacitive element CF2.

Figure 3:
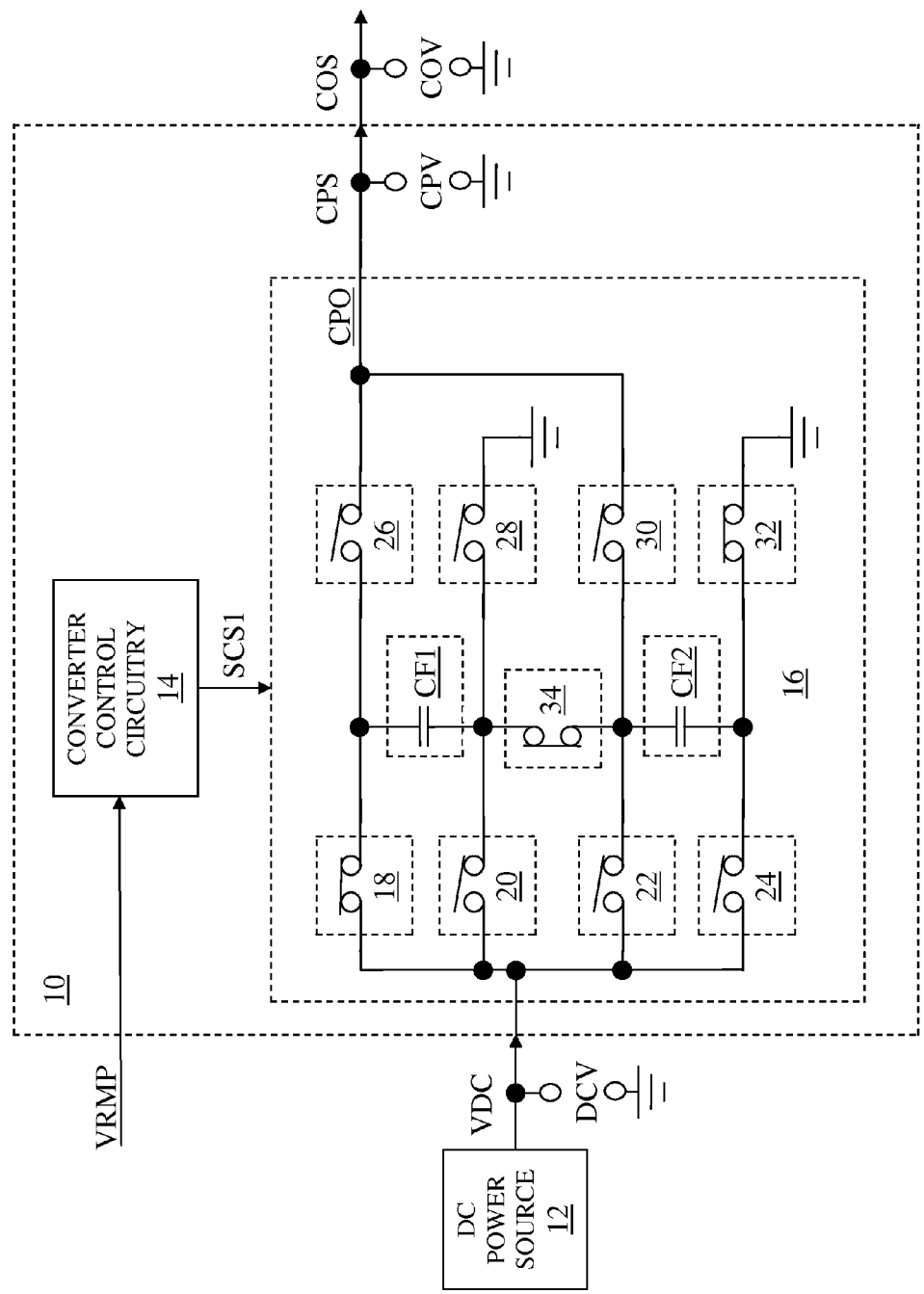
FIG. 3 shows details of the boosting charge pump illustrated in FIG. 1 according to an alternate embodiment of the boosting charge pump.

FIG. 3 shows details of the boosting charge pump 16 illustrated in FIG. 1 according to an alternate embodiment of the boosting charge pump 16. The boosting charge pump 16 illustrate in FIG. 3 is similar to the boosting charge pump 16 illustrated in FIG. 2, except in the boosting charge pump 16 illustrated in FIG. 3, the converter control circuitry 14 has selected the boost disabled mode to at least partially charge the first flying capacitive element CF1 and the second flying capacitive element CF2.

As such, in the boosting charge pump 16 illustrated in FIG. 3, the DC source voltage DCV is above the first source threshold and the setpoint of the converter output voltage COV is above the DC source voltage DCV. Therefore, the converter control circuitry 14 is preparing the boosting charge pump 16 for the first boost operating mode. As such, the first switching element 18, the eighth switching element 32, and the ninth switching element 34 are in the CLOSED state and the second switching element 20, the third switching element 22, the fourth switching element 24, the fifth switching element 26, the sixth switching element 28, and the seventh switching element 30 are in the OPEN state. As such, the charge pump output CPO is isolated from the first flying capacitive element CF1 and the second flying capacitive element CF2.

Additionally, the first flying capacitive element CF1 and the second flying capacitive element CF2 are coupled in series between the DC power source 12 and ground via the first switching element 18, the eighth switching element 32 and the ninth switching element 34. Therefore, if the boosting charge pump 16 remains in the boost disabled mode long enough, the first flying capacitive element CF1 and the second flying capacitive element CF2 will charge until a voltage across each of the first flying capacitive element CF1 and the second flying capacitive element CF2 is equal to around about one-half times the DC source voltage DCV.

Figure 4:
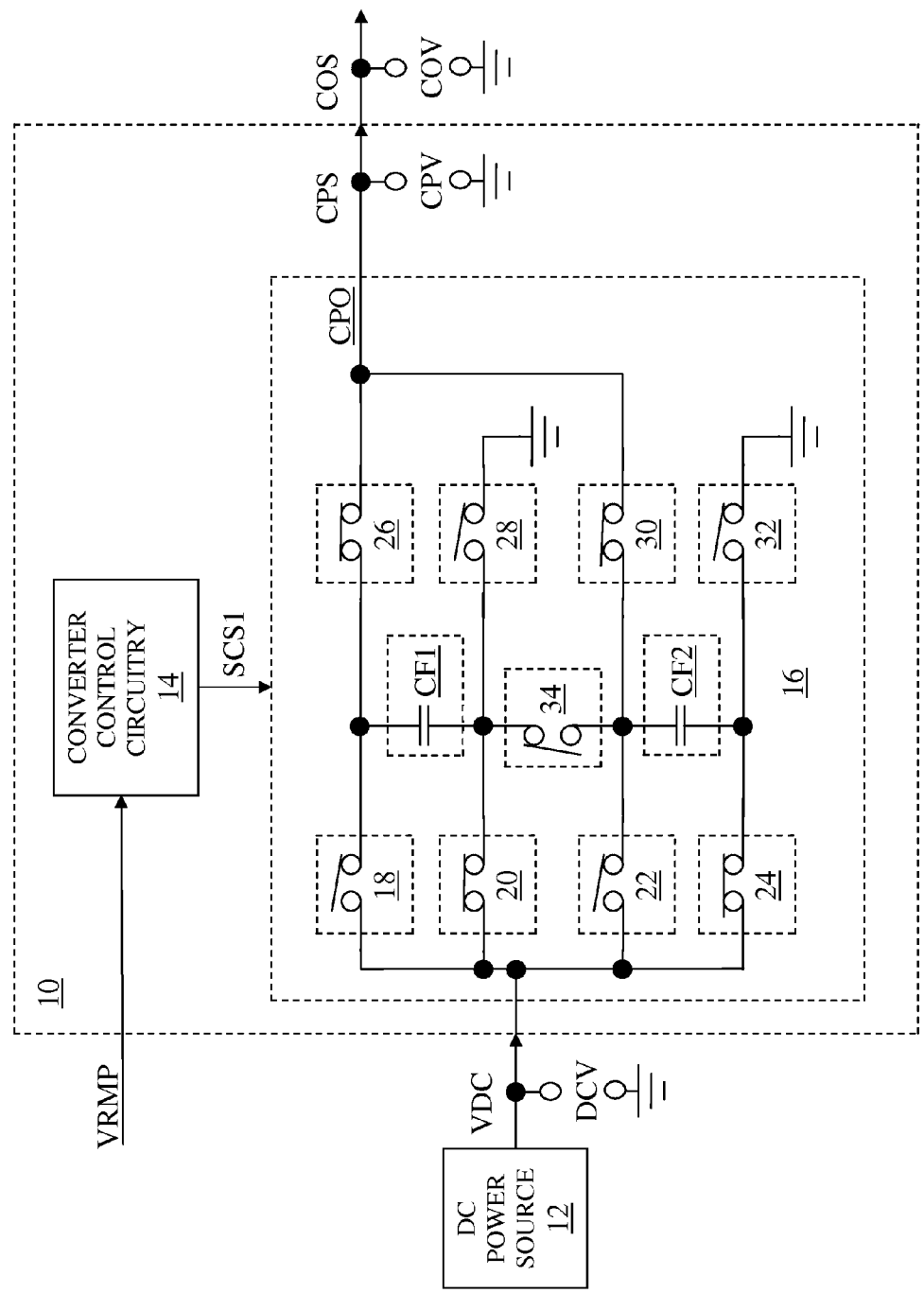
FIG. 4 shows details of the boosting charge pump illustrated in FIG. 1 according to an additional embodiment of the boosting charge pump.

FIG. 4 shows details of the boosting charge pump 16 illustrated in FIG. 1 according to an additional embodiment of the boosting charge pump 16. The boosting charge pump 16 illustrate in FIG. 4 shows a transition from the boost disabled mode illustrated in FIG. 3 to the first boost operating mode. While in the boost disabled mode, the converter control circuitry 14 prepares the boosting charge pump 16 for the first boost operating mode by charging the first flying capacitive element CF1 and the second flying capacitive element CF2 until the voltage across each of the first flying capacitive element CF1 and the second flying capacitive element CF2 is equal to around about one-half times the DC source voltage DCV.

However, during the first boost operating mode, the first switching element 18, the third switching element 22, the sixth switching element 28, the eighth switching element 32, and the ninth switching element 34 are in the OPEN state, and the second switching element 20, the fourth switching element 24, the fifth switching element 26, and the seventh switching element 30 are in the CLOSED state, thereby coupling the first flying capacitive element CF1 and the second flying capacitive element CF2 in parallel with one another to form a parallel combination, which is coupled between the DC power source 12 and the charge pump output CPO. Using the parallel combination instead of using a single flying capacitive element reduces a voltage drop across switching elements and flying capacitive elements, thereby increasing the efficiency of the DC-DC converter 10.

As such, the DC source voltage DCV provided by the DC power source 12 combined with the one-half times the DC source voltage DCV provided by the first flying capacitive element CF1 and the second flying capacitive element CF2 provides around about one and one-half times the DC source voltage DCV at the charge pump output CPO.

Figure 5:
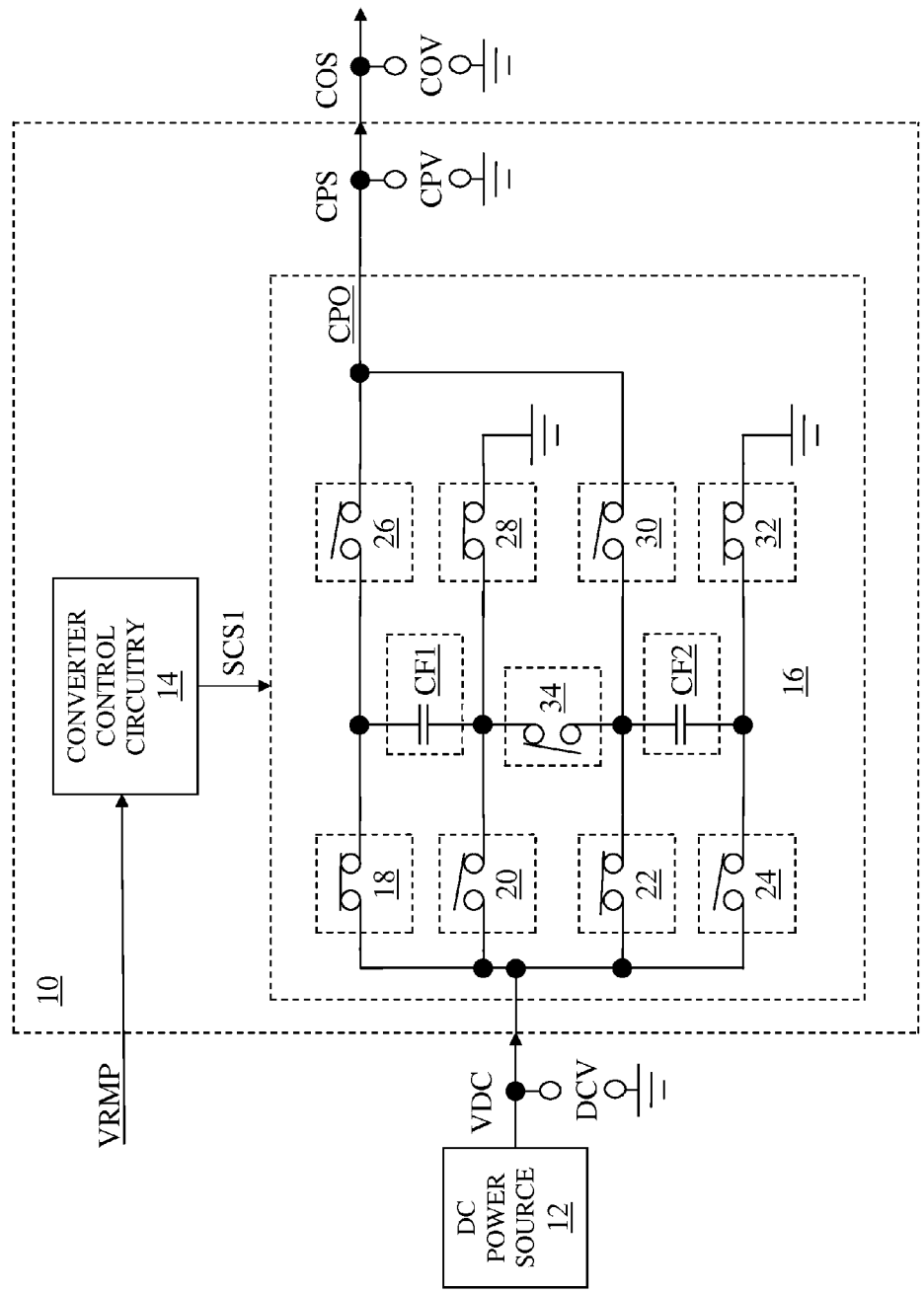
FIG. 5 shows details of the boosting charge pump illustrated in FIG. 1 according to another embodiment of the boosting charge pump.

FIG. 5 shows details of the boosting charge pump 16 illustrated in FIG. 1 according to another embodiment of the boosting charge pump 16. The boosting charge pump 16 illustrated in FIG. 5 is similar to the boosting charge pump 16 illustrated in FIG. 2, except in the boosting charge pump 16 illustrated in FIG. 5, the converter control circuitry 14 has selected the boost disabled mode to at least partially charge the first flying capacitive element CF1 and the second flying capacitive element CF2.

As such, in the boosting charge pump 16 illustrated in FIG. 5, the DC source voltage DCV is below the first source threshold and the setpoint of the converter output voltage COV is above the DC source voltage DCV. Therefore, the converter control circuitry 14 is preparing the boosting charge pump 16 for the second boost operating mode. As such, the first switching element 18, the third switching element 22, the sixth switching element 28, and the eighth switching element 32 are in the CLOSED state, and the second switching element 20, the fourth switching element 24, the fifth switching element 26, the seventh switching element 30, and the ninth switching element 34 are in the OPEN state. As such, the charge pump output CPO is isolated from the first flying capacitive element CF1 and the second flying capacitive element CF2.

Additionally, the first flying capacitive element CF1 and the second flying capacitive element CF2 are coupled in parallel with one another to form a parallel via the first switching element 18, the third switching element 22, the sixth switching element 28, and the eighth switching element 32. The parallel combination is coupled between the DC power source 12 and ground. Therefore, if the boosting charge pump 16 remains in the boost disabled mode long enough, the first flying capacitive element CF1 and the second flying capacitive element CF2 will charge until a voltage across each of the first flying capacitive element CF1 and the second flying capacitive element CF2 is equal to around about the DC source voltage DCV.

Figure 6:
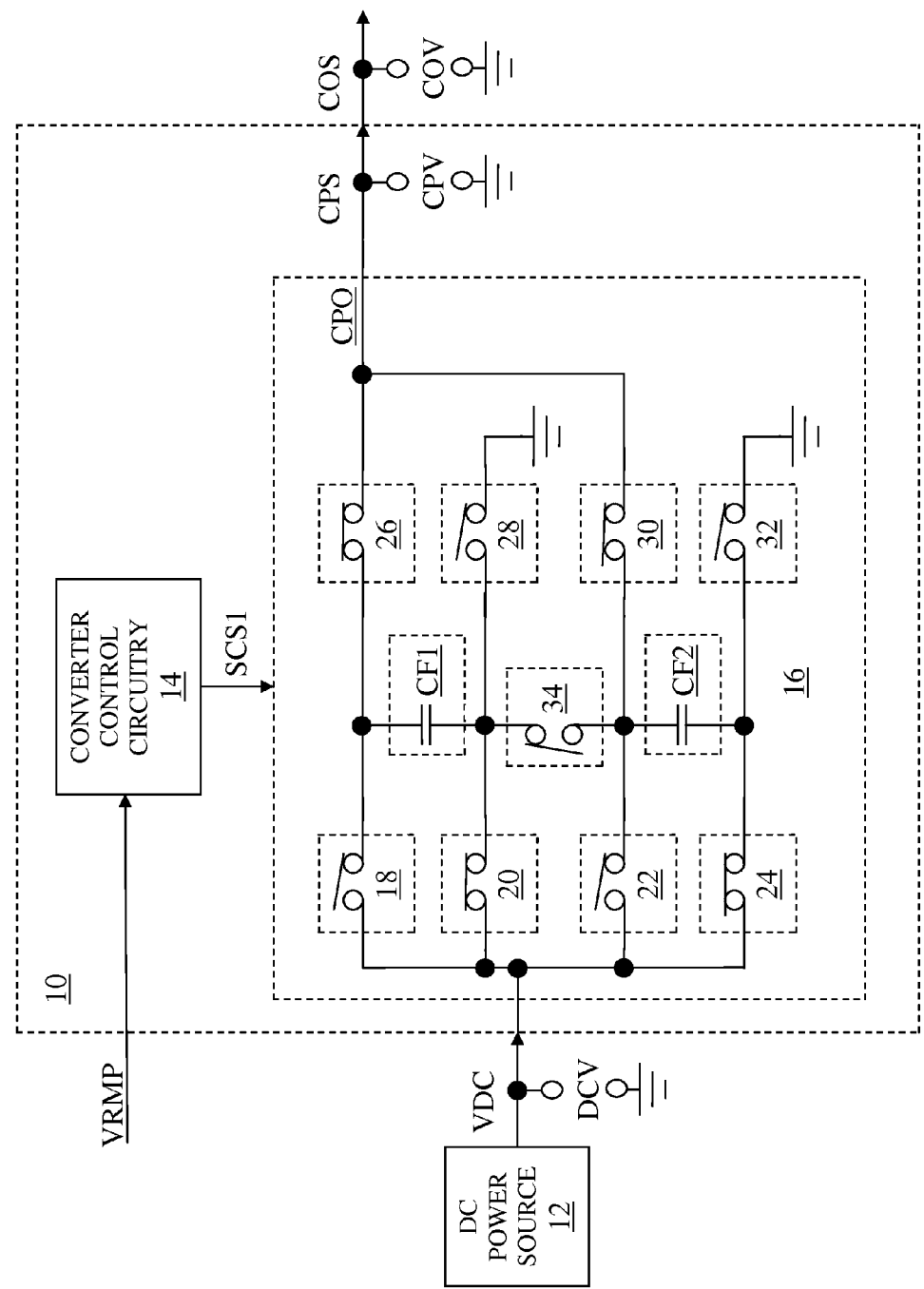
FIG. 6 shows details of the boosting charge pump illustrated in FIG. 1 according to a further embodiment of the boosting charge pump.

FIG. 6 shows details of the boosting charge pump 16 illustrated in FIG. 1 according to a further embodiment of the boosting charge pump 16. The boosting charge pump 16 illustrate in FIG. 6 shows a transition from the boost disabled mode illustrated in FIG. 5 to the second boost operating mode. While in the boost disabled mode, the converter control circuitry 14 prepares the boosting charge pump 16 for the second boost operating mode by charging the first flying capacitive element CF1 and the second flying capacitive element CF2 until the voltage across each of the first flying capacitive element CF1 and the second flying capacitive element CF2 is equal to around about the DC source voltage DCV.

However, during the second boost operating mode, the first switching element 18, the third switching element 22, the sixth switching element 28, the eighth switching element 32, and the ninth switching element 34 are in the OPEN state, and the second switching element 20, the fourth switching element 24, the fifth switching element 26, and the seventh switching element 30 are in the CLOSED state, thereby coupling the first flying capacitive element CF1 and the second flying capacitive element CF2 in parallel with one another to form a parallel combination, which is coupled between the DC power source 12 and the charge pump output CPO. Using the parallel combination instead of using a single flying capacitive element reduces a voltage drop across switching elements and flying capacitive elements, thereby increasing the efficiency of the DC-DC converter 10.

As such, the DC source voltage DCV provided by the DC power source 12 combined with the additional DC source voltage DCV provided by the first flying capacitive element CF1 and the second flying capacitive element CF2 provides around about two times the DC source voltage DCV at the charge pump output CPO.

Figure 7:
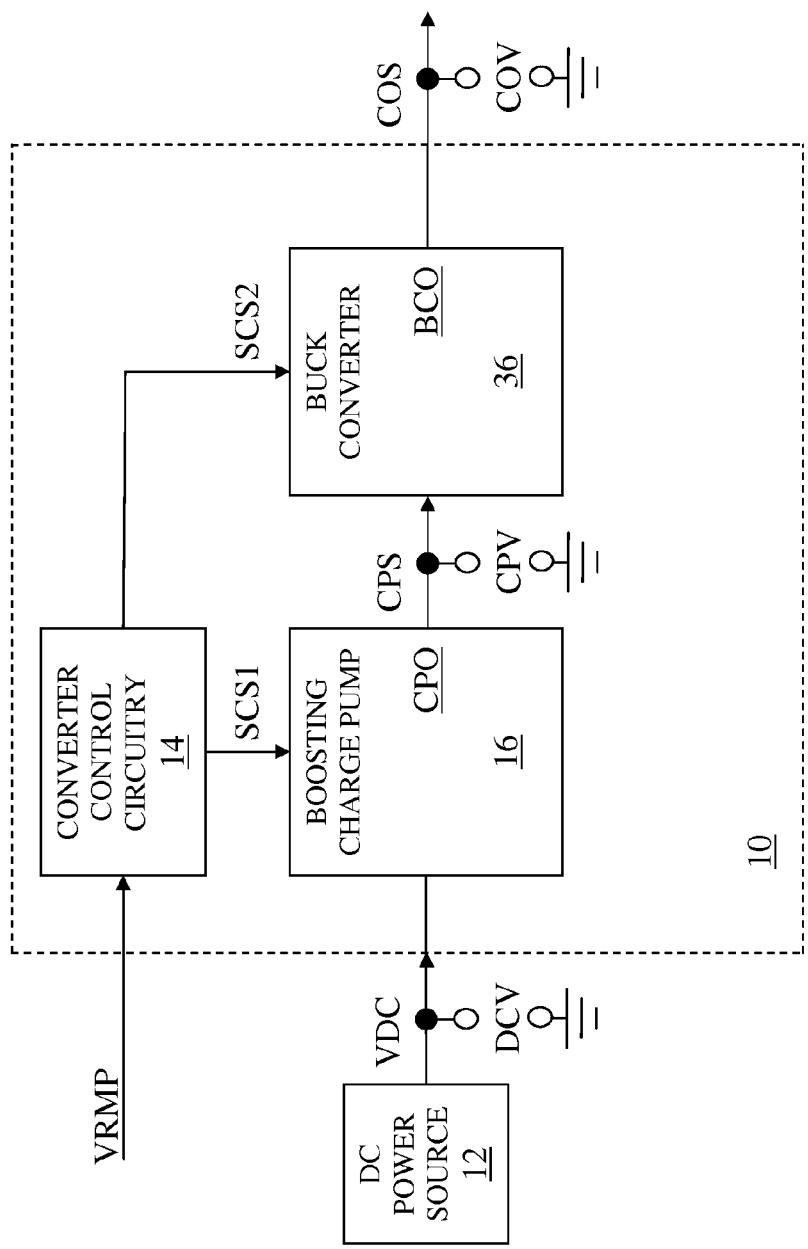
FIG. 7 shows the DC-DC converter and the DC power source according to an alternate embodiment of the DC-DC converter and the DC power source.

FIG. 7 shows the DC-DC converter 10 and the DC power source 12 according to an alternate embodiment of the DC-DC converter 10 and the DC power source 12. The DC-DC converter 10 illustrated in FIG. 7 is similar to the DC-DC converter 10 illustrated in FIG. 1, except the DC-DC converter 10 illustrated in FIG. 7 further includes a buck converter 36 coupled to the boosting charge pump 16. The buck converter 36 has a buck converter output BCO, such that the buck converter 36 provides the charge pump output signal CPS via the buck converter output BCO. As such, the buck converter 36 provides the converter output voltage COV via the buck converter output BCO.

The converter control circuitry 14 provides a second charge pump switching control signal SCS2 to the boosting charge pump 16. As such, the converter control circuitry 14 controls operation of the boosting charge pump 16 via the second charge pump switching control signal SCS2. During the first boost operating mode and the second boost operating mode, the buck converter 36 provides the converter output signal COS using the charge pump output signal CPS. Therefore, during the first boost operating mode and the second boost operating mode, the buck converter 36 provides the converter output voltage COV via the buck converter output BCO using the charge pump output voltage CPV.

Figure 8:
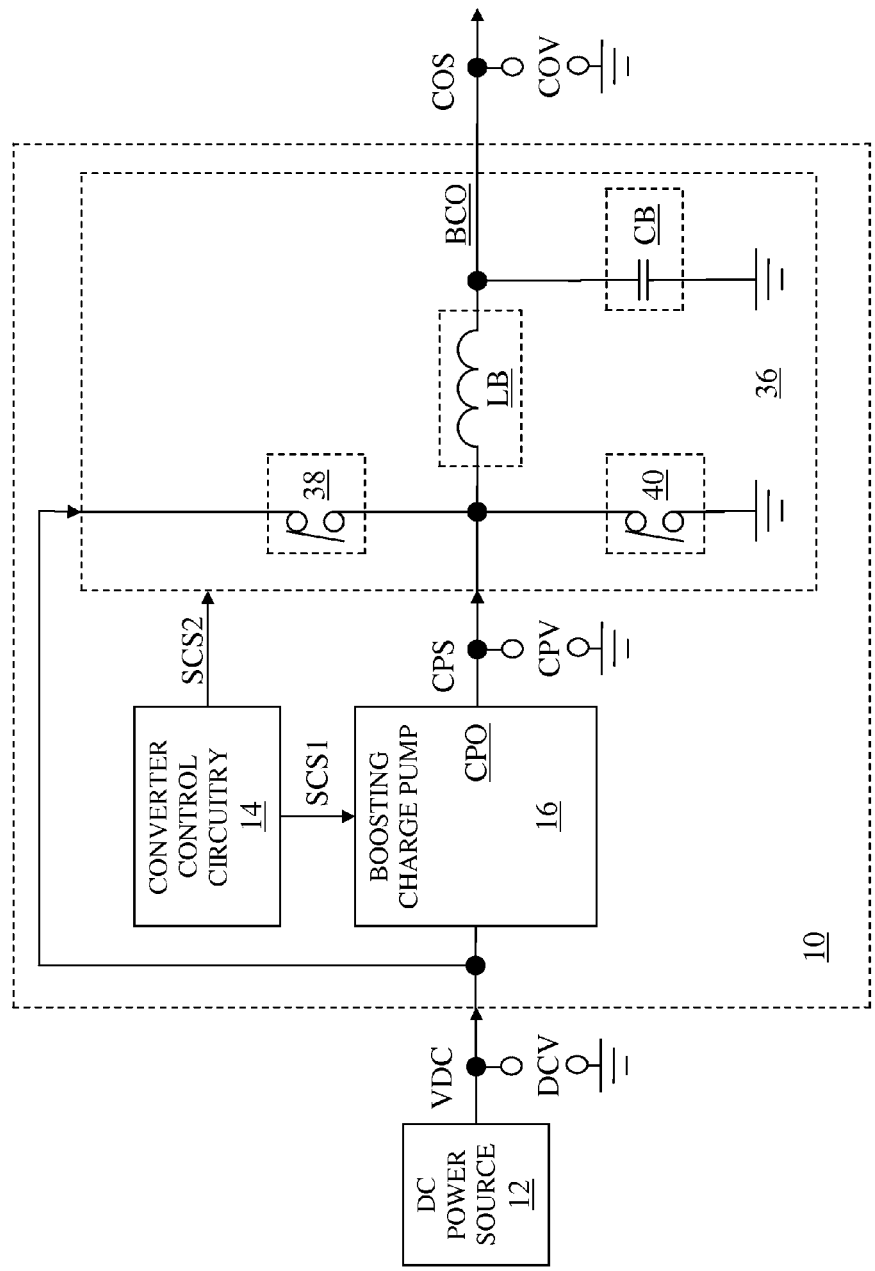
FIG. 8 shows details of a buck converter illustrated in FIG. 7 according to one embodiment of the buck converter.

FIG. 8 shows details of the buck converter 36 illustrated in FIG. 7 according to one embodiment of the buck converter 36. The buck converter 36 includes a tenth switching element 38, an eleventh switching element 40, a buck inductive element LB, and a buck capacitive element CB. The tenth switching element 38 is coupled between the DC power source 12 and the charge pump output CPO. The eleventh switching element 40 is coupled between the charge pump output CPO and ground. The buck inductive element LB is coupled between the charge pump output CPO and the buck converter output BCO. The buck capacitive element CB is coupled between the buck converter output BCO and ground. The buck inductive element LB and the buck capacitive element CB form a lowpass filter.

The converter control circuitry 14 controls each of the switching elements 38, 40 in the buck converter 36 using the second charge pump switching control signal SCS2. As such, each of the switching elements 38, 40 is selected to be in one of an OPEN state and a CLOSED state based on the second charge pump switching control signal SCS2. As such, the second charge pump switching control signal SCS2 is a multi-bit signal. Further, during the boost disabled mode, since the boosting charge pump 16 presents a high impedance at the charge pump output CPO, either the tenth switching element 38 or the eleventh switching element 40, but not both simultaneously, are in the CLOSED state based on the second charge pump switching control signal SCS2.

In this regard, in one embodiment of the buck converter 36, during the boost disabled mode, when the tenth switching element 38 is in the CLOSED state, the eleventh switching element 40 is in the OPEN state and the DC power source 12 is coupled to the charge pump output CPO, such that a nominal value of the charge pump output voltage CPV is equal to about the DC source voltage DCV. Conversely, during the boost disabled mode, when the tenth switching element 38 is in the OPEN state and the eleventh switching element 40 is in the CLOSED state, ground is coupled to the charge pump output CPO, such that a nominal value of the charge pump output voltage CPV is equal to about zero volts.

As previously mentioned, during the first boost operating mode, the nominal value of the charge pump output voltage CPV is equal to about one and one-half times the DC source voltage DCV. During the second boost operating mode, the nominal value of the charge pump output voltage CPV is equal to about two times the DC source voltage DCV. However, in one embodiment of the DC-DC converter 10, the converter control circuitry 14 will only select one of the first boost operating mode and the second boost operating mode based on the DC source voltage DCV. If the DC source voltage DCV is too high, the converter control circuitry 14 will not select the second boost operating mode. Instead, the converter control circuitry 14 will select the first boost operating mode if a boosting voltage is needed. However, if the DC source voltage DCV is too low, the converter control circuitry 14 will not select the first boost operating mode. Instead, the converter control circuitry 14 will select the second boost operating mode if a boosting voltage is needed.

As such, when a boosting voltage is needed, the converter control circuitry 14 selects a first voltage for the charge pump output voltage CPV, which may nominally be equal to either about one and one-half times the DC source voltage DCV or about two times the DC source voltage DCV. As such, the converter control circuitry 14 uses the first charge pump switching control signal SCS1 to select either the first boost operating mode or the second boost operating mode. Further, the converter control circuitry 14 uses the second charge pump switching control signal SCS2 to de-select the tenth switching element 38 and the eleventh switching element 40 by placing the tenth switching element 38 and the eleventh switching element 40 in their respective OPEN states. As such, the converter control circuitry 14 uses both the first charge pump switching control signal SCS1 and the second charge pump switching control signal SCS2 to select the first voltage for the charge pump output voltage CPV.

If a boosting voltage is not needed, the converter control circuitry 14 selects the boost disabled mode. As such, during the boost disabled mode, the converter control circuitry 14 selects either a second voltage for the charge pump output voltage CPV or a third voltage for the charge pump output voltage CPV using the first charge pump switching control signal SCS1 and the second charge pump switching control signal SCS2. In one embodiment of the converter control circuitry 14, the second voltage for the charge pump output voltage CPV is nominally equal to about the DC source voltage DCV. In one embodiment of the converter control circuitry 14, the third voltage for the charge pump output voltage CPV is nominally equal to about zero volts, which is a bucking voltage.

In one embodiment of the converter control circuitry 14, the converter output voltage COV is fed back to the converter control circuitry 14, such that the converter control circuitry 14 selects between the first voltage, the second voltage, and the third voltage for the charge pump output voltage CPV using the first charge pump switching control signal SCS1 and the second charge pump switching control signal SCS2 to regulate the converter output voltage COV based on the setpoint of the converter output voltage COV.

Figure 9:
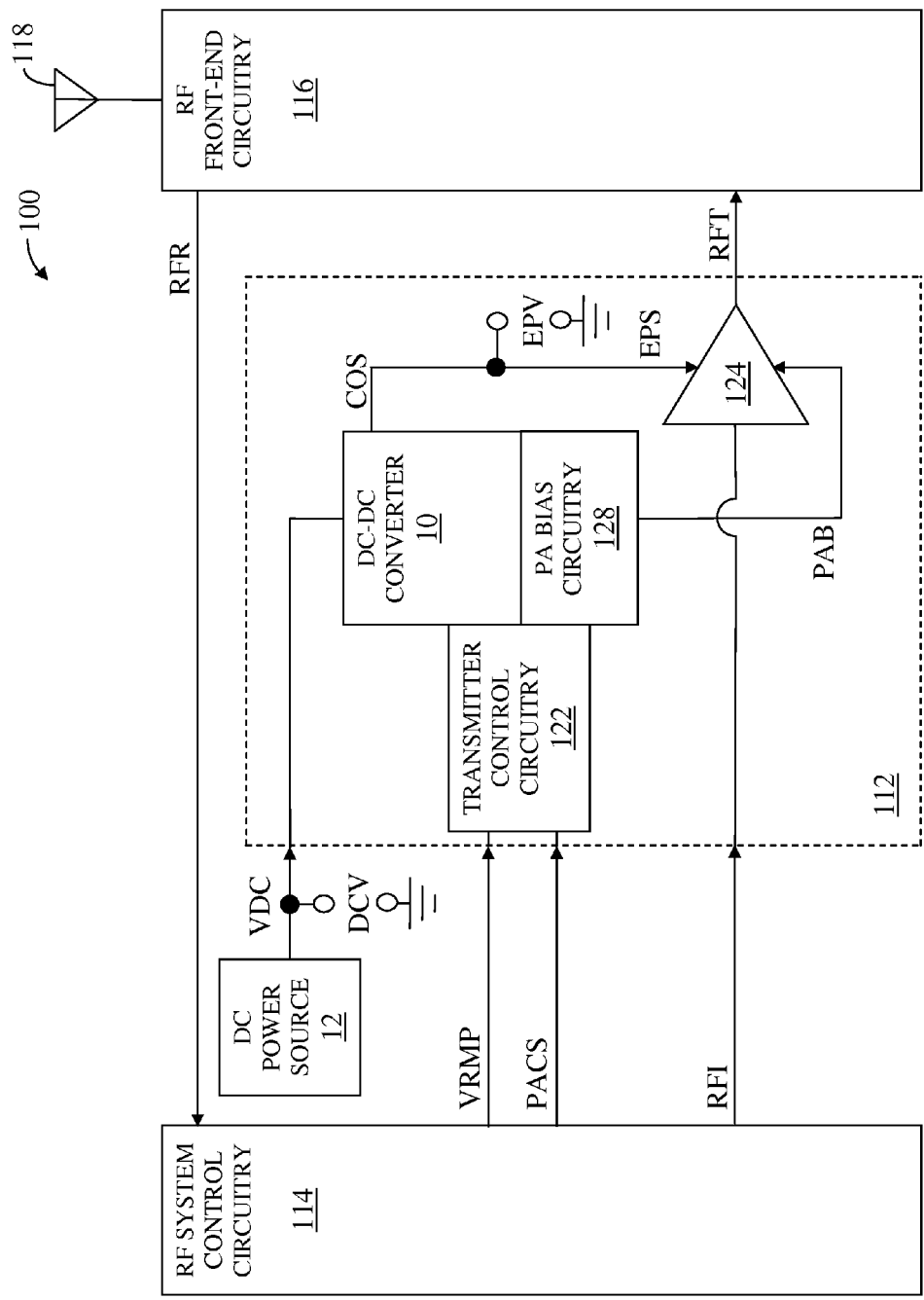
FIG. 9 shows an RF communications system according to one embodiment of the RF communications system.

FIG. 9 shows an RF communications system 100 according to one embodiment of the RF communications system 100. The RF communications system 100 includes RF transmitter circuitry 112, RF system control circuitry 114, RF front-end circuitry 116, an RF antenna 118, and the DC power source 12. The RF transmitter circuitry 112 includes transmitter control circuitry 122, an RF power amplifier (PA) 124, the DC-DC converter 10, and PA bias circuitry 128.

In one embodiment of the RF communications system 100, the RF front-end circuitry 116 receives via the RF antenna 118, processes, and forwards an RF receive signal RFR to the RF system control circuitry 114. The RF system control circuitry 114 provides the power supply control signal VRMP and a transmitter configuration signal PACS to the transmitter control circuitry 122. The transmitter control circuitry 122 forwards the power supply control signal VRMP to the DC-DC converter 10.

Control circuitry selects one of an envelope tracking mode and an average power tracking mode. In one embodiment of the RF communications system 100, the RF system control circuitry 114 includes the control circuitry. As such, the transmitter configuration signal PACS is indicative of the selection of the one of the envelope tracking mode and the average power tracking mode. In an alternate embodiment of the RF communications system 100, the transmitter control circuitry 122 includes the control circuitry that selects the one of the envelope tracking mode and the average power tracking mode. In one embodiment of the control circuitry, the control circuitry selects the average power tracking mode when an average output power from the RF PA 124 is less than a power threshold.

The RF system control circuitry 114 provides an RF input signal RFI to the RF PA 124. The DC power source 12 provides the DC source signal VDC to the DC-DC converter 10. In one embodiment of the DC power source 12, the DC power source 12 is a battery. The DC source signal VDC has the DC source voltage DCV. The transmitter control circuitry 122 is coupled to the DC-DC converter 10 and to the PA bias circuitry 128. The DC-DC converter 10 provides the converter output signal COS, which is an envelope power supply signal EPS, to the RF PA 124 based on the power supply control signal VRMP. The envelope power supply signal EPS has an envelope power supply voltage EPV. The DC source signal VDC provides power to the DC-DC converter 10. As such, the envelope power supply signal EPS is based on the DC source signal VDC. The power supply control signal VRMP is representative of a setpoint of the envelope power supply signal EPS.

During both the envelope tracking mode and the average power tracking mode, the RF PA 124 receives and amplifies the RF input signal RFI to provide an RF transmit signal RFT using the envelope power supply signal EPS. The envelope power supply signal EPS provides power for amplification. In one embodiment of the RF communications system 100, during the envelope tracking mode, the envelope power supply signal EPS at least partially envelope tracks the RF transmit signal RFT. In one embodiment of the RF communications system 100, during the average power tracking mode the envelope power supply voltage EPV is about equal to the DC source voltage DCV.

The RF front-end circuitry 116 receives, processes, and transmits the RF transmit signal RFT via the RF antenna 118. In one embodiment of the RF transmitter circuitry 112, the transmitter control circuitry 122 configures the RF transmitter circuitry 112 based on the transmitter configuration signal PACS. The PA bias circuitry 128 provides a PA bias signal PAB to the RF PA 124. In this regard, the PA bias circuitry 128 biases the RF PA 124 via the PA bias signal PAB. In one embodiment of the PA bias circuitry 128, the PA bias circuitry 128 biases the RF PA 124 based on the transmitter configuration signal PACS. In one embodiment of the RF front-end circuitry 116, the RF front-end circuitry 116 includes at least one RF switch, at least one RF amplifier, at least one RF filter, at least one RF duplexer, at least one RF diplexer, at least one RF amplifier, the like, or any combination thereof.

In one embodiment of the RF system control circuitry 114, the RF system control circuitry 114 is RF transceiver circuitry, which may include an RF transceiver IC, baseband controller circuitry, the like, or any combination thereof. In one embodiment of the DC-DC converter 10, the DC-DC converter 10 operates in the selected one of the envelope tracking mode and the average power tracking mode. During both the envelope tracking mode and the average power tracking mode, the DC-DC converter 10 regulates the envelope power supply signal EPS to be about equal to the setpoint of the envelope power supply signal EPS.

Figure 10:
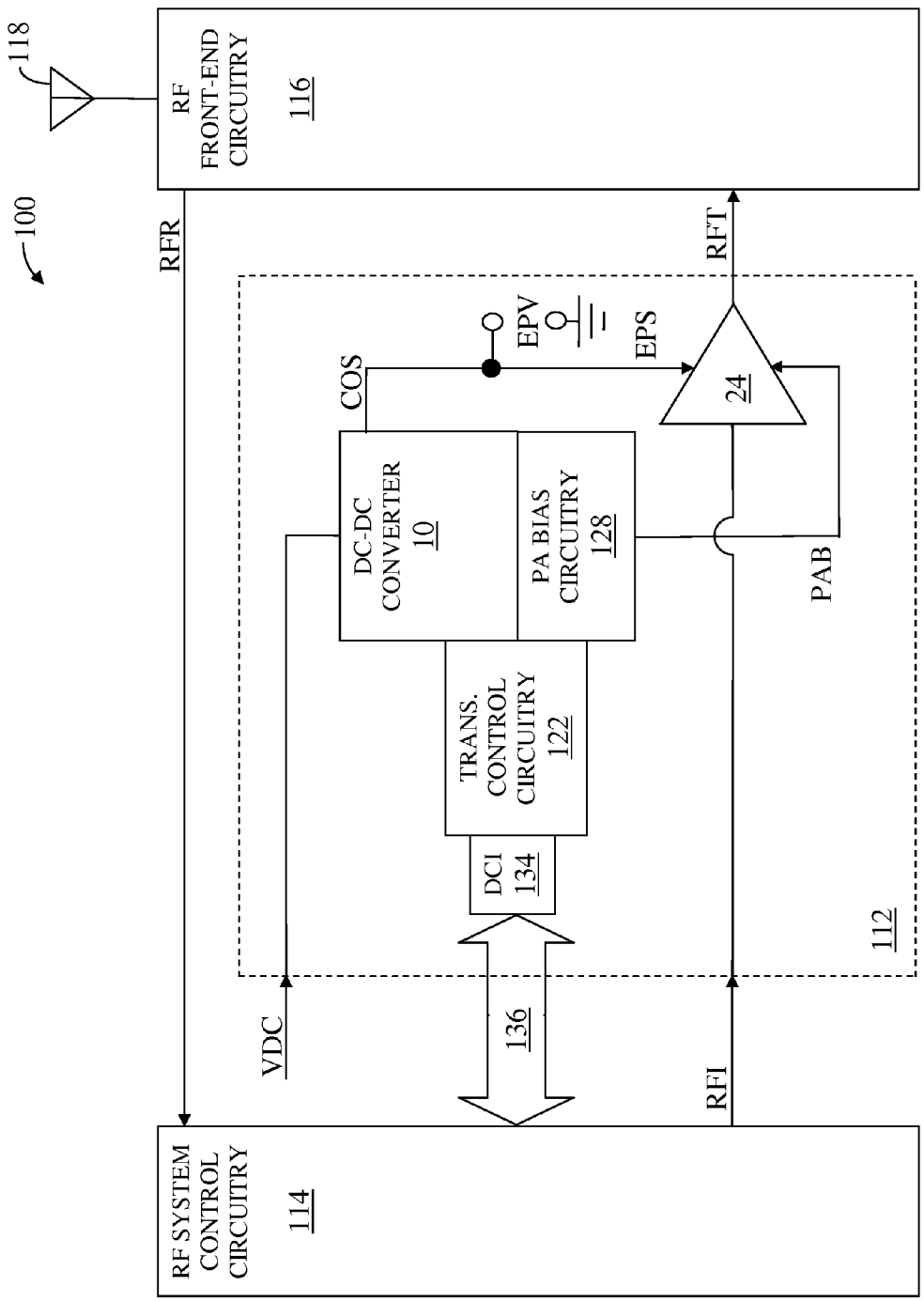
FIG. 10 shows the RF communications system according to an alternate embodiment of the RF communications system.

FIG. 10 shows the RF communications system 100 according to an alternate embodiment of the RF communications system 100. The RF communications system 100 illustrated in FIG. 10 is similar to the RF communications system 100 illustrated in FIG. 9, except in the RF communications system 100 illustrated in FIG. 10, the RF transmitter circuitry 112 further includes a digital communications interface 134, which is coupled between the transmitter control circuitry 122 and a digital communications bus 136. The digital communications bus 136 is also coupled to the RF system control circuitry 114. As such, the RF system control circuitry 114 provides the power supply control signal VRMP (FIG. 9) and the transmitter configuration signal PACS (FIG. 9) to the transmitter control circuitry 122 via the digital communications bus 136 and the digital communications interface 134.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. A DC-DC converter configured to provide a converter output voltage using a DC source voltage and comprising:
    converter control circuitry configured to select one of a first boost operating mode, a second boost operating mode, and a boost disabled mode based on the DC source voltage, and further configured to select the boost disabled mode when a setpoint of the converter output voltage is less than the DC source voltage minus an operating headroom; and
    a boosting charge pump having a charge pump output and configured to:
        during the boost disabled mode, present a high impedance at the charge pump output;
        during the first boost operating mode, provide a charge pump output voltage via the charge pump output, such that a nominal value of the charge pump output voltage is equal to about one and one-half times the DC source voltage; and during the second boost operating mode, provide the charge pump output voltage via the charge pump output, such that a nominal value of the charge pump output voltage is equal to about two times the DC source voltage.

2. The DC-DC converter of claim 1 wherein the converter control circuitry is further configured to select the first boost operating mode when the DC source voltage is above a first source threshold and when a setpoint of the converter output voltage is above the DC source voltage.

3. The DC-DC converter of claim 2 wherein a maximum voltage rating of switching transistor elements in the DC-DC converter is greater than two times the first source threshold.

4. The DC-DC converter of claim 1 wherein the converter control circuitry is further configured to select the second boost operating mode when the DC source voltage is below a first source threshold and when a setpoint of the converter output voltage is above the DC source voltage.

5. The DC-DC converter of claim 4 wherein a maximum voltage rating of switching transistor elements in the DC-DC converter is greater than two times the first source threshold.

6. The DC-DC converter of claim 1 wherein the charge pump output voltage is the converter output voltage.

7. A DC-DC converter configured to provide a converter output voltage using a DC source voltage and comprising:
    converter control circuitry configured to select one of a first boost operating mode, a second boost operating mode, and a boost disabled mode based on the DC source voltage, and further configured to select the boost disabled mode to at least partially charge a first flying capacitive element and at least partially charge a second flying capacitive element; and
    a boosting charge pump comprising the first flying capacitive element and the second flying capacitive element and having a charge pump output and configured to:
        during the boost disabled mode, present a high impedance at the charge pump output;
        during the first boost operating mode, provide a charge pump output voltage via the charge pump output, such that a nominal value of the charge pump output voltage is equal to about one and one-half times the DC source voltage; and
        during the second boost operating mode, provide the charge pump output voltage via the charge pump output, such that a nominal value of the charge pump output voltage is equal to about two times the DC source voltage.

8. The DC-DC converter of claim 7 wherein during the boost disabled mode, when the DC source voltage is above a first source threshold and when a setpoint of the converter output voltage is above the DC source voltage, the first flying capacitive element and the second flying capacitive element are coupled in series between a DC power source and a ground, such that a voltage across each of the first flying capacitive element and the second flying capacitive element is equal to around about one-half times the DC source voltage.

9. The DC-DC converter of claim 7 wherein during the boost disabled mode, when the DC source voltage is below a first source threshold and when a setpoint of the converter output voltage is above the DC source voltage, the first flying capacitive element and the second flying capacitive element are coupled in parallel with one another to form a parallel combination, which is coupled between a DC power source and a ground.

10. The DC-DC converter of claim 7 wherein during the first boost operating mode and the second boost operating mode, the first flying capacitive element and the second flying capacitive element are coupled in parallel with one another to form a parallel combination, which is coupled between a DC power source and the charge pump output.

11. The DC-DC converter of claim 1 wherein a DC power source is configured to provide the DC source voltage.

12. The DC-DC converter of claim 11 wherein the DC power source is a battery.

13. The DC-DC converter of claim 1 wherein the converter control circuitry is further configured to receive a power supply control signal, which is representative of a setpoint of the converter output voltage.

14. The DC-DC converter of claim 1 wherein the converter control circuitry is further configured to control operation of the boosting charge pump using a first charge pump switching control signal.

15. A DC-DC converter configured to provide a converter output voltage using a DC source voltage and comprising:
    converter control circuitry configured to select one of a first boost operating mode, a second boost operating mode, and a boost disabled mode based on the DC source voltage;
    a boosting charge pump having a charge pump output and configured to:
        during the boost disabled mode, present a high impedance at the charge pump output;
        during the first boost operating mode, provide a charge pump output voltage via the charge pump output, such that a nominal value of the charge pump output voltage is equal to about one and one-half times the DC source voltage; and
        during the second boost operating mode, provide the charge pump output voltage via the charge pump output, such that a nominal value of the charge pump output voltage is equal to about two times the DC source voltage; and
    a buck converter having a buck converter output and coupled to the boosting charge pump, such that during the first boost operating mode and the second boost operating mode, the buck converter is configured to provide the converter output voltage via the buck converter output using the charge pump output voltage.

16. The DC-DC converter of claim 1 wherein the converter control circuitry is further configured to select between a first voltage, a second voltage, and a third voltage for the charge pump output voltage using a first charge pump switching control signal and a second charge pump switching control signal to regulate the converter output voltage based on a setpoint of the converter output voltage.

17. The DC-DC converter of claim 16 wherein the first voltage is nominally equal to one of about one and one-half times the DC source voltage and about two times the DC source voltage, the second voltage is nominally equal to about the DC source voltage, and the third voltage is nominally equal to about zero volts.

18. The DC-DC converter of claim 1 wherein the DC-DC converter is further configured to provide a converter output signal, which has the converter output voltage, such that the converter output signal is an envelope power supply signal, which provides power for amplification to a radio frequency power amplifier.

19. The DC-DC converter of claim 18 wherein the radio frequency power amplifier is configured to receive and amplify a radio frequency input signal to provide a radio frequency transmit signal using the envelope power supply signal.

\* \* \* \* \*